United States Patent [19]

Barron et al.

[11] Patent Number: 5,300,320

[45] Date of Patent: Apr. 5, 1994

[54] CHEMICAL VAPOR DEPOSITION FROM SINGLE ORGANOMETALLIC PRECURSORS

[75] Inventors: Andrew R. Barron, Cambridge; Michael B. Power, Quincy; Andrew N. MacInnes, Dorchester, all of Mass.; Aloysius F. Hepp, Bay Village; Phillip P. Jenkins, Cleveland Heights, both of Ohio

[73] Assignee: President and Fellows of Harvard College, Cambridge, Mass.

[21] Appl. No.: 903,256

[22] Filed: Jun. 23, 1992

[51] Int. Cl.$^5$ .................................... C23C 16/00
[52] U.S. Cl. .......................... 427/249; 427/255; 423/446; 156/DIG. 68
[58] Field of Search .................. 427/248.1, 255, 249; 423/446; 156/DIG. 68

[56] References Cited

U.S. PATENT DOCUMENTS 4,477,311 10/1984 Mimura et al. .................. 427/307

OTHER PUBLICATIONS

Power et al., "Interaction of Tris-tert-butyl gallium with Elemental Sulfur, Selenium, and Tellurium" Organometallics, 1992, 11(3) 1055-1063.
Nomura et al., Preparation of $CuIn_5S_8$ Thin Films by SingleSource Organometallic Chemical Vapour Deposition, *Thin Solid Films*, 209, 145-147 (1992).
Nomura et al., Preparation and Characterization of n-and i-Butylindium Thiolate, *Polyhedron*, 8(6):763-767 (1989).
Sandroff et al., Stucture and Stability of Passivating Arsenic Sulfide Phasees on GaAs Surfaces, *J. Vac. Sci.*, B7(4):841-844 (1989).
Wang et al., Surface Passivation of GaAs with $P_2S_5$-containing Solutions, *J. Appl. Phys.*, 71(6):2746-2756 (1992).
Turco et al., Thermal and Chemical Stability of Se--passivated GaAs Surfaces, *J. Vac. Sci Technol*, B8(4):856-859 (1990).
Oigawa et al., Hetero-Epitaxy of Layered Compound Semiconductor GaSe onto GaAs Surfaces for Very Effective Passivation of Nanometer Structures, 267 43-46 (1992).
Besser et al., Comparison of Surface Properties of Sodium Sulfide and Ammonium Sulfide Passivation of GaAs, *J. Appl. Phys.*, 65(11):4306-4310 (1989).
Tao et al., S-Passivated InP (100)-(1X1) Surface Prepared By A Wet Chemical Process, *Appl. Phys. Lett.*, 60(21):2669-2671 (1992).
MacImmes. A. N., et al., "Chemical Vapor Deposition of Cubic Gallium Sulfide Thin Films: A New Metastable Phase," *Materials*, 4(1):17-20 (1992).

*Primary Examiner*—Shrive Beck
*Assistant Examiner*—David M. Maiorana
*Attorney, Agent, or Firm*—Hamilton, Brook, Smith & Reynolds

[57] ABSTRACT

A method is disclosed for forming a passivating/buffer film on a substrate. The method includes heating the substrate to a temperature which is sufficient to cause a volatilized organometallic precursor to pyrolyze and thereby form a passivating/buffer film on a substrate. The organometallic precursor is volatilized at a precursor source. A carrier gas is directed from a carrier gas source across the precursor source to conduct the volatilized precursor from the precursor source to the substrate. The volatilized precursor pyrolyzes and is deposited onto the substrate, thereby forming the passivating-/buffer film on the substrate. The passivating/buffer film can be a cubic-phase passivating/buffer film. An oxide layer can also be formed on the passivating/buffer film to thereby form a composite of the substrate, the passivating/buffer film and the oxide layer. Cubic-phase passivating/buffer films formed by the method of the invention can be lattice-matched with the substrate. Electronic or electro-optical circuits or circuit elements can be formed which include passivating/buffer films formed by the method of the invention.

23 Claims, 6 Drawing Sheets

CHEMICAL VAPOR DEPOSITION FROM SINGLE ORGANOMETALLIC PRECURSORS

GOVERNMENT SUPPORT

This invention was made with Government support under Grant N00014-91-J-1934 awarded by the Department of the Navy. The Government has certain rights in the invention.

BACKGROUND OF THE INVENTION

Group 13-16 materials, and in particular, gallium arsenide (GaAs), have been employed recently in an increasing variety of electronic and electro-optical uses. For example, integrated circuits which are based on active layers of gallium arsenide, such as metal insulator semiconductor field-effect transistors (MISFETs), monolithic microwave integrated circuits (MMICs), and fast-logic circuits, have been employed in digital signal processing for military, biomedical, and communicationsystems applications. Gallium arsenide has also been employed in the fabrication of minority charge-carrier devices, such as solar cells and photodetectors. In addition, optical sources, such as lasers and light-emitting diodes (LEDs), have been developed which are of Group 13-16 materials, such as GaAs for the lasant medium.

However, surface states of gallium arsenide provide sites for non-radiative recombination. Therefore, passivation is generally required to maintain the mobility of charge carriers. Examples of known methods of passivating gallium arsenide include deposition or growth of oxides, nitrides or sulfides by various techniques, such as molecular beam epitaxy (MBE), physical vapor deposition (PVD), or electrochemical deposition.

Alternatively, buffer layers are enclosed to provide an intermediate transitional layer between a semiconductor substrate and subsequent layers to be formed over the substrate. For example, high-resistance buffer layers isolate circuits formed in active gallium arsenide layers from the underlying substrate. See, for example, U.S. Pat. No. 4,952,527, issued Aug. 28, 1990.

There are several problems associated with known methods of passivating gallium arsenide and with forming buffer layers on gallium arsenide For example, more than one chemical precursor is typically required to form the chemical compound deposited on gallium arsenide substrate. Use of multiple precursors often causes formation of impurities and consequent irregular composition of the passivating/buffer layer by incorporation of impurities in the passivation layer during deposition. Further, some passivating/buffer layers, such as arsenic trisulfide, which can be formed by known methods, are often toxic. In addition, sulfurizing techniques generally form passivating layers which are relatively unstable. Also, known methods for deposition of passivating/buffer layers often require exposure of the gallium arsenide substrate to high temperatures, which can degrade the substrate. In addition, there are other problems commonly associated with known methods of deposition, such as slow deposition rates, and the requirement of expensive, complicated equipment for conducting deposition on gallium arsenide substrates.

Therefore, a need exists for an improved method for forming a passivating/buffer films on gallium arsenide or other semiconductor substrates, which overcome or minimize the above-listed problems.

SUMMARY OF THE INVENTION

The present invention relates to a method for forming a film on a substrate.

The method includes heating the substrate to a temperature sufficient to cause a volatilized precursor, which consists essentially of a single organometallic compound, to pyrolyze the volatilized precursor and cause the pyrolyzed precursor to be deposited on the substrate. The precursor is volatilized at a precursor source. A carrier gas from a carrier gas source is directed across the precursor source to conduct the volatilized precursor from the precursor source to the substrate, whereby the volatilized precursor is pyrolyzed and is deposited onto the substrate, thereby forming the film on the substrate. The organometallic compound can be a cubane or cubane-forming organometallic compound.

A composite material, formed by the method of the invention, includes a substrate and a cubic-phase film. The cubic-phase film includes a first component selected from Group 13 of the Periodic Table and a second component selected from Group 16 of the Periodic Table, wherein the first and second components are arranged as face-centered cubic-phase cells of a crystal structure.

In another embodiment, a composite, formed by the method of the invention, includes a substrate, a cubic-phase film which is formed on the substrate, and an oxide layer formed on the cubic-phase film.

This invention has many advantages. For example, the film is formed by metal-organic chemical vapor deposition (MOCVD) from a single organometallic precursor. As a consequence, no toxic impurities are contained within the film. Further, a film having a substantially uniform crystal structure is deposited, resulting in a significantly reduced likelihood that defects will develop in the film. Further, cubic-phase films are formed, thereby enabling the formation of crystal structures which lattice-match the crystal structure of the substrate upon which additional films can subsequently be formed. Lattice-matching, in turn, further reduces the likelihood that defects in the film will develop. Also, cubic-phase films significantly enhance photoluminescence intensity by reducing non-radiative recombination centers and by reducing surface recombination velocity (SRV). In addition, these cubic-phase films have a large band gap. Therefore, the quality of electro-optical substrate components, such as those formed of gallium arsenide, are significantly increased. In addition, the cubic-phase films can themselves be employed as semiconductors. Further, the films which are formed by the method of the invention are relatively stable. The films can be passivating or buffer films. Also, the buffer films formed by the method of the invention can be employed in electronic or electro-optical components which include an oxide, or insulation layer. For example, the buffer film can be disposed between a substrate and an oxide layer.

DETAILED DESCRIPTION OF THE INVENTION

The features and other details of the invention, either as steps of the invention or as combinations of parts of the invention, will now be more particularly described and pointed out in the claims. It will be understood that the particular embodiments of the invention are shown by way of illustration and not as limitations of the invention. The principle features of the invention may be employed in various embodiments without departing from the scope of the invention.

The method of the invention generally includes forming a film on a substrate from a single organometallic precursor. First, an organometallic precursor is volatilized at a precursor source. A carrier gas is then directed from a carrier gas source across the precursor source to conduct the volatilized organometallic precursor from the precursor source to the substrate. The volatilized organic precursor is pyrolyzed and the pyrolyzed precursor is deposited onto the substrate, thereby forming the film on the substrate.

The substrate can be formed of Group 13-16 materials, such as single-crystal gallium arsenide, which can be used to form semiconductor devices, such as FETs, semiconductor lasers or diode lasers. Thus, while the description herein may, at times, refer to semiconductor substrates, no such limitation on the scope of the invention is intended thereby. Further, although the films of the invention and the films formed by the method of the invention may be referred to as passivating/buffer films, it is to be understood the use of these films is not intended to be limited to such purposes.

Figure 1:
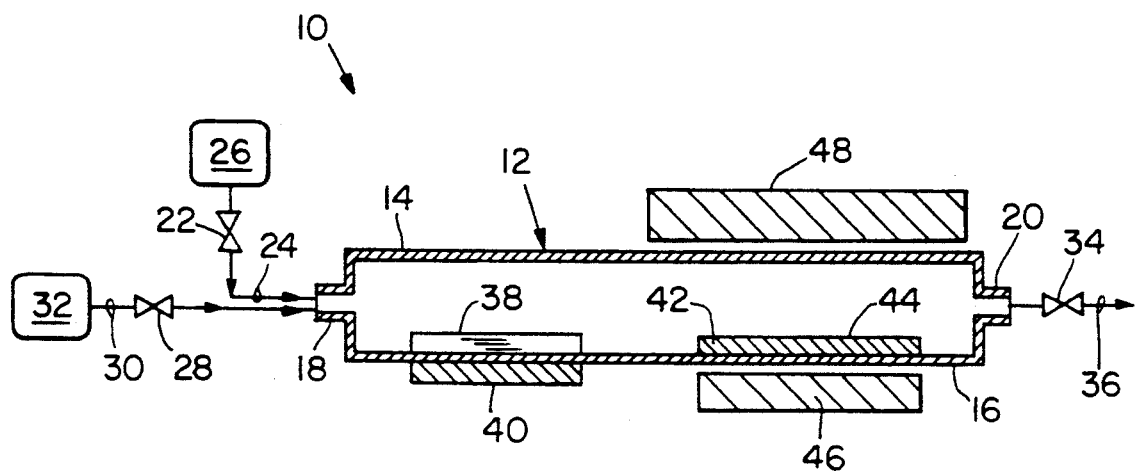
FIG. 1 is a schematic representation of one embodiment of a system which is suitable for depositing a film on a substrate by the method of the invention.

System 10, shown in FIG. 1, is one embodiment of a system which is suitable for conducting the method of the invention. System 10 includes housing 12 having first end 14 and second end 16. Inlet 18 is disposed at first end 14. Outlet 20 is disposed at second end 16. An example of a suitable housing is a laminar-flow hot-wall glass reactor. Alternatively, the system can include a suitable metal-organic vapor deposition reactor. An example of a suitable metal-organic vapor deposition reactor is disclosed in U.S. Pat. No. 4,839,145, the teachings of which are incorporated herein by reference. Valve 22 is disposed at conduit 24, which extends between carrier gas source 26 and inlet 18. Valve 28 is disposed at conduit 30, which extends between oxygen source 32 and inlet 18. Valve 34 is disposed at conduit 36, which extends from outlet 20.

Precursor source 38 is disposed within first end 14 of housing 12. Precursor heating element 40 is disposed outside housing 12 at first end 14 and proximate to precursor source 38. Precursor heating element 40 is suitable for heating precursor at precursor source 38 in an amount sufficient to volatilize precursor within first end 14 of housing 12.

Substrate 42, onto which a passivating/buffer film is to be formed by the method of the invention, is disposed within second end 16 of housing 12. Substrate 42 includes upward surface 44, which is suitable for deposition of a passivating/buffer film by the method of the invention. Substrate 42 within housing 12 is suitable for deposition of a passivating/buffer layer on upward surface 42 by the method of the invention. Examples of suitable semiconductor or electro-optical substrates include gallium arsenide and indium phosphide substrates. A suitable metal, such as aluminum or a compound thereof, can be included in the crystal structure of substrate 42., A particularly preferred substrate is gallium arsenide Heating plate 46 is disposed on the exterior of the housing 12 at second end 16 and is proximate to substrate 42. Heating plate 46 is suitable for heating substrate 42 within second end 16 of housing 12 in an amount sufficient to cause pyrolysis of volatilized precursor at second end 16 and consequent deposition of the pyrolyzed precursor onto upward surface 44 of substrate 42. Insulator 48 is disposed over housing 12 at second end 16.

Precursor at precursor source 38 is an organometallic compound. The organometallic compound includes at least one element from Group 13 of the Periodic Table, and at least one element from Group 16 of the Periodic Table. In addition, the organometallic compound includes at least one butyl group. The butyl group is either a tertiary or a normal-type butyl group. In one embodiment, the organometallic precursor is a compound which, upon pyrolysis and deposition upon substrate, will form an amorphous passivating/buffer layer. An example of such an organometallic precursor is [($^t$Bu)GaS]$_7$. The procedure for formation of [($^t$Bu)GaS]$_7$, can be found in Example I, shown below.

Other examples of suitable organometallic compounds which can be employed by the method of the invention to form non-cubic buffer films, such as non-cubic crystalline passivating/buffer films, on s include [($^n$Bu)InS]$_x$ and [($^n$Bu)InSe]$_x$, wherein x is in the range of between about four and eight; [($^t$Bu)$_2$In(S$^t$Bu)]$_3$; and [($^t$Bu)$_2$In(S$^t$Bu)]$_3$. The method by which [($^n$Bu)InS]$_x$, [($^n$Bu)InS]$_x$ is formed can be found in Cowley et al., *Angew. Chem. Int. Ed. Engl.*, 30(9):1143-1145 (1991), the teachings of which are incorporated by reference, wherein indium is substituted for gallium. The method by which [($^t$Bu)$_2$In(S$^t$Bu)]$_2$ and [($^n$Bu)$_2$In(S$^t$Bu)]$_3$ can be formed is shown below in Example II. Still another organometallic compound which is suitable for forming an amorphous passivating/buffer on substrate 42 by the method of the invention is [($^t$Bu)$_2$Ga(S$^t$Bu)]$_2$. The method by which this organometallic precursor can be formed is described in Power et al., *Organometallics*, 11(3):1055-1060 (1992), the teachings of which are incorporated herein by reference.

In another embodiment, the precursor at precursor source 38 is a cubane or cubane-forming organometallic precursor. Suitable cubane and cubane-forming organometallic precursors are those which, when employed in the method of the invention, will form a cubic-phase passivating/buffer film on substrate 42. Cubic-phase films, as term is employed herein, have a cubic-phase crystal structure, such as a face-centered cubic-phase crystal structure, or a cubic-like structure, such as a tetragonal structure.

Cubane organometallic precursors are those which have a cubane molecular structure. Examples of suitable cubane organometallic precursors include [($^t$Bu)GaS]$_4$, [($^t$Bu)AlS]$_4$, [($^t$Bu)GaSe]$_4$, and [($^t$Bu)GaTe]$_4$. The method by which these cubane organometallic precursors can be formed is described in: Cowley et al., *Angew. Chem. Int. Ed. Engl.*,30(9):1143–1145 (1991); Power et al., *J. Chem. Soc., Chem. Comm.*,11315 (1991); and Power et al., *Organometallics*,11 (3):1055–1060 (1992), the teachings of all of which are incorporated herein by reference.

Cubane-forming organometallic precursors are those which acquire a cubane molecular structure during volatilization or pyrolysis according to the method of the invention. An example of a suitable cubane-forming organometallic precursor is [($^t$Bu)GaS]$_6$. The method by which this cubane-forming organometallic precursor is formed can be found in Example III, shown below.

Substrate heating plate 46 is heated in an amount sufficient to heat substrate 42 in housing 12 to a temperature which is sufficient to cause volatilized precursor at second end 16 of housing to pyrolyze and thereby be deposited upon upward surface 44 of substrate 42. In one embodiment, substrate 42 is heated to a temperature in the range of between about 100° and 800° C. Preferably, substrate 42 is heated to a temperature in the range of between about 250° C. and 550° C.

Precursor heating element 40 is heated to a temperature which is sufficient to volatilize the precursor at precursor source 38 within first end 14 of housing 12. In one embodiment, precursor heating element 40 is heated to a temperature in the range of between about 50° C. and 250° C. Preferably, precursor heating element 40 is heated to a temperature in the range of between about 100° C. and about 250° C. The precursor at precursor source 38 is thereby volatilized at first end 14 of housing 12.

Valve 22 is opened and carrier gas is directed from carrier gas source 26 through conduit 24 and inlet 18 of housing 12. The carrier gas is substantially inert in the presence of volatilized precursor within housing 12. Examples of suitable carrier gases include argon, hydrogen, nitrogen, etc. Carrier gas directed into housing 12 is conducted within housing 12 from first end 14 to second end 14 of housing 12, and thereby directs volatilized precursor at first end 14 to substrate 42 at second end 16 of housing 12.

Volatilized precursor at second end 16 of housing 12 is pyrolyzed by heat radiated from substrate 42, thereby forming a pyrolyzed precursor which deposits onto upward surface 44 of substrate 42. The pyrolyzed precursor is allowed to collect on upward surface 44 of substrate 42 until the amount of the pyrolyzed precursor which has accumulated is sufficient to enable formation of a passivating/buffer film having a desired thickness. In one embodiment, the thickness of the passivating/buffer film to be formed is in the range of between about 100 Å and about 10,000 Å. Preferably, the thickness of the passivating/buffer layer to be formed is in the range of between about 2,000 Å and about 5,000 Å.

When the desired amount of pyrolyzed precursor has accumulated on upward surface 44 of substrate 42, the flow of carrier gas from carrier gas source 26 into housing 12 is secured by closing valve 22. Also, precursor heating element 40 is allowed to cool, thereby discontinuing volatilization of precursor at precursor source 38.

In addition, substrate heating plate 46 is allowed to cool, thereby allowing substrate 42 and the pyrolyzed precursor on substrate 42 to also cool. In the embodiment wherein an organometallic precursor is employed which is not a cubane or cubane-forming organometallic precursor, the passivating/buffer film which is formed on substrate 42 is an amorphous or non-cubic crystalline passivating/buffer film. Alternatively, in the embodiment wherein a cubane or cubane-forming metal organic precursor is employed, the passivating/buffer film which forms on substrate 42 is a cubic-phase passivating/buffer film.

In a preferred embodiment, a semiconductor or electro-optical substrate and an organometallic precursor can be selected so that the passivating/buffer film has a crystal structure which is lattice-matched with the crystal structure of the substrate. For example, in one embodiment, the substrate is gallium arsenide, and the organometallic precursor is [($^t$Bu)GaS]$_4$, which is a cubane organometallic precursor. The [($^t$Bu)GaS]$_4$ forms a cubic-phase gallium sulfide passivating/buffer film on the substrate. The cubic-phase gallium sulfide passivating/buffer film is lattice-matched with the gallium arsenide substrate. Another example of a combination of a substrate and a passivating/buffer film that is lattice-matched with the substrate includes a buffer film of indium sulfide on a semiconductor or electro-optical substrate of indium phosphide.

In a particularly preferred embodiment, the passivating/buffer film formed on substrate 42 has an element in common with the crystal of substrate 42. For example, a passivating/buffer film of gallium sulfide, on a substrate of gallium arsenide, includes gallium as an element which is common to both the passivating/buffer film and substrate 42.

An insulating layer can be formed on the passivating/buffer film disposed on substrate 42. Examples of suitable insulating layers include oxides, silicides, borides and carbides. In one embodiment, valve 28 is opened and an oxygen-containing gas is directed from oxygenation source 32 through conduit 30 and inlet 18 into housing 12. Examples of suitable oxygen-containing gases include oxygen gas ($O_2$), dinitrogen oxide ($N_2O$) and ozone ($O_3$). The oxygen-containing gas is conducted to second end 16 of housing 12 and to substrate 42. Exposure of the passivating/buffer film to the oxygen-containing gas causes a component of the passivating/buffer film at an exposed surface of the passivating/buffer film to oxidize, thereby forming an oxide layer on the passivating/buffer film.

Figure 2:
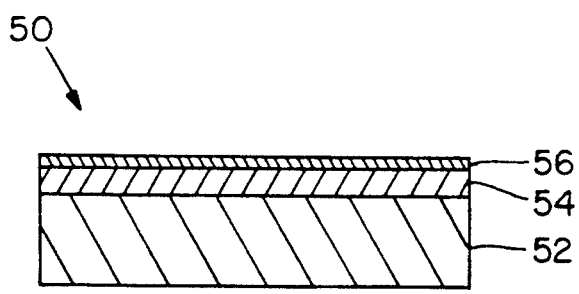
FIG. 2 is a section view of one embodiment of a composite of the invention.

Composite 50, formed by the method of the invention, is shown in FIG. 2. Composite 50 includes substrate 52. Passivating/buffer film 54 is disposed on substrate 52. In one embodiment, passivating/buffer film 54 is a cubic-phase passivating/buffer film. Passivating/buffer film 54 includes a first component, selected from Group 13 of the Periodic Table, and a second component, selected from Group 16 of the Periodic Table. Oxide layer 56 is disposed on passivating/buffer film.

Figure 3:
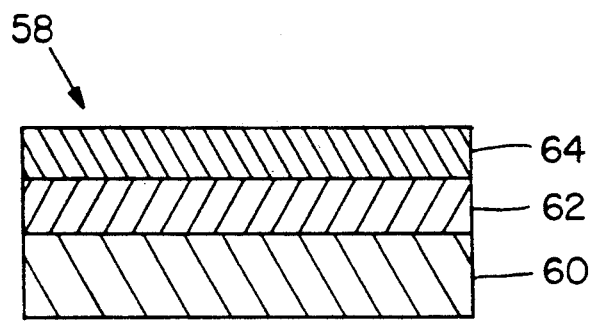
FIG. 3 is a section view of another embodiment of a composite of the invention.

It is to be understood that, alternatively, other types of layers/films can be formed on the passivating/buffer film disposed on substrate 42. Examples of suitable types of layers/films which can be formed on the passivating/buffer film include semiconductor, conductor and/or an additional passivating/buffer films. The additional films can be formed on the passivating/buffer film by known methods or by the method of the invention. In one alternate embodiment, shown in FIG. 3, composite 58 includes substrate 60, passivating/buffer film 62 formed on substrate 60, and active film 64 formed on passivating/buffer film 62. Active film 64 can be formed selectively on passivating/buffer film 62. Examples of suitable substrates include gallium arsenide and gallium phoshide. Examples of suitable passivating/buffer films are those discussed above with reference to FIG. 1. Suitable active films 64 include, for example, gallium arsenide, gallium phosphide, and gallium aluminum arsenide (GaAlAs). Quantum wells of gallium arsenide and gallium aluminum arsenide can also be included.

Figure 4:
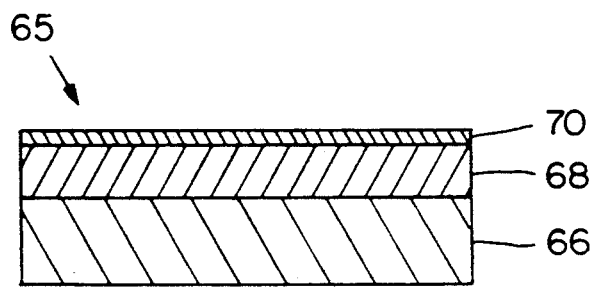
FIG. 4 is a section view of still another embodiment of a composite of the invention.
Figure 5:
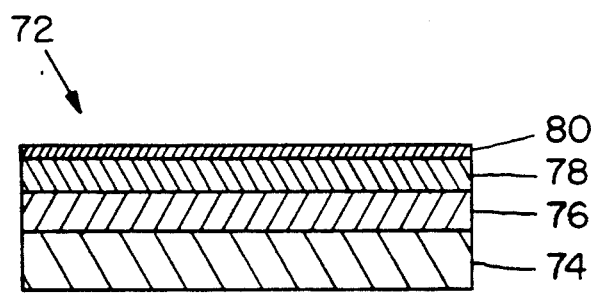
FIG. 5 is a section view of another embodiment of a composite of the invention.

In another alternate embodiment, shown in FIG. 4, composite 64 includes substrate 66, passivating/buffer film 68 formed on substrate 66, and conductor film 70 formed on passivating/buffer film 68. Conductor film 70 can be formed selectively on passivating/buffer film 68. Examples of suitable conductor films include gold, silver and aluminum. In still another embodiment, shown in FIG. 5, composite 72 includes substrate 74, passivating/buffer film 76 formed on substrate 74, active layer 78 formed on passivating/buffer film 76, and conductor layer 80 formed on active layer 78. Active layer 78 and conductor layer 80 can be formed selectively.

Figure 6:
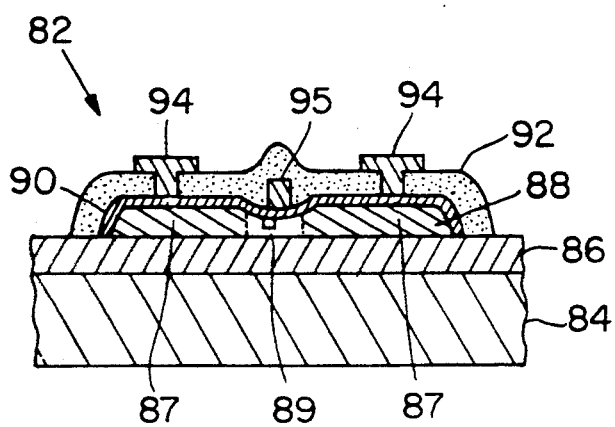
FIG. 6 is a section view of a transistor of the invention.

Electronic circuits can also be formed by the method of the invention which employ the composites and passivating/buffer films of the invention. For example, field-effect transistor (FET) 82, shown in FIG. 6, includes substrate 84. Buffer film 86 is formed on substrate 84 by the method of the invention. It is to be understood that buffer film 86 can be a cubic-phase buffer film which is comprised, for example, of gallium sulfide. Next, active semiconductor layer 88 is formed on buffer film 86 and on doped regions 87,89, respectively. Active semiconductor layer 88 can be formed selectively on buffer film 86, such as by photolithography, etching, etc. Next, insulating film 90, comprised, for example, of alumina ($Al_2O_3$), is formed selectively on active semiconductor layer 88, such as by photolithography, etching, etc. Source, drain, and channel regions are formed in active semiconductor layer 88, such as by ion beam doping of such regions after gate region 95 is deposited on insulating film 90. Passivating layer 92, formed, for example, of gallium sulfide, is then formed over insulator film 90. Electrical contacts and/or interconnectors 94 are formed by etching openings to active semiconductor layer 88 and selectively depositing metallization, thereby forming FET 82.

The invention will now be further and specifically described by the following examples. All parts and percentages are by weight unless otherwise stated.

EXAMPLE I

[($^t$Bu)GaS]$_7$ was formed by refluxing [($^t$Bu)GaS]$_4$ (1.0 g, 1.57 mmol) in hexane (50 mL) for 4 days. The resulting solution was reduced to dryness under vacuum, leaving a white solid. $^1$H NMR indicated this to be a new species containing only small amounts (<15%) of [($^t$Bu)GaS]$_4$. [$^t$BuGaS]$_7$ was obtained pure by fractional crystallization, being more soluble in hexane than [($^t$Bu)GaS]$_4$. Yield 0.79 g, 80%. MS, m/z (EI, %) 1054 (7M+-$^t$Bu, 100%); (CI, Isobutane, %) 1112 (7M+, 25%), 1054 (7M+-$^t$Bu, 15%). IR (Nujol): 1172(s), 1009(m), 941(w), 807(s), 660(w), 529(w), 510(w). NMR ($C_6D_6$): $^1$H 1.27 [27H s, C(CH$_3$)$_3$], 1.23 [9H, s, C(CH$_3$)$_3$], 1.19 [27H, s, C(CH$_3$)$_3$]. $^{13}$C 30.07 [C(CH$_3$)$_3$], 30.01 [C(CH$_3$)$_3$], 29.93 [C(CH$_3$)$_3$], 29.21 [C(CH$_3$)$_3$], 27.74 [C(CH$_3$)$_3$], 27.48 [C(CH$_3$)$_3$].

Melting points were determined in sealed capillaries and are uncorrected. Thermogravimetric and differential thermal analysis were measured on a Seiko 200 TG/DTA instrument. Mass spectra were recorded using a JEOL AX-505H mass spectrometer and associated data system. An electron beam energy of 70 eV was used for EI mass spectra. Isobutane was used as a reagent gas for CI mass spectra. All spectra were recorded at 1500 mass resolution. Reported m/z values are for the predominant ion within the isotope pattern for each signal. IR spectra (4000–400 cm$^{-1}$) were recorded on a Nicolet 5ZDX-FTIR spectrometer as Nujol mulls on KBr plates. $^1$H and $^{13}$C NMR spectra (in $C_6D_6$ unless otherwise stated) were recorded on a Bruker AM-500 spectrometer, and chemical shifts are reported in parts per million relative to external SiMe$_4$ in CDCl$_3$. [($^t$Bu)GaS]$_4$ was prepared according to the following published procedures: Power et al., *J. Chem. Soc., Chem. Commun.*: 1315 (1991); and Power et al., *Organometallics*, 11: 1055 (1992), the teachings of which are incorporated herein by reference. All manipulations were carried out under an atmosphere of dry nitrogen. Solvents were distilled and degassed before use.

EXAMPLE II

Synthesis of [($^t$Bu)$_2$In($\mu$-S$^t$Bu)]$_2$ was performed as follows: A pentane solution of tris-tert-butylindium (4.03 g, 14.1 mmol) was added to an excess of tert-butylthiol (ca. 3 cm$^3$) in pentane. The resulting solution was stirred for 30 minutes at room temperature, after which the solvent wa removed in vacuo. Yield: 4.5 g, 100%. The product was hygroscopic and was stored under an inert atmosphere. Mass spectrum: m/z (EI) 579 (2M+-$^t$Bu), 465 (2M+-3$^t$Bu). IR (cm$^{-1}$): 2946(m), 2925(m), 2893(w), 2858(w), 2828(s), 1460(s), 1361(m), 1261(m), 1151(s), 1097(m, br), 1012(m), 805(s), 575(w). NMR ($\delta$, $C_6D_6$): $^1$H 1.50 [18 H, InC(CH$_3$)$_3$], 1.37 [9 H, SC(CH$_3$)$_3$]. $^{13}$C 45.48 [SC(CH$_3$)$_3$], 37.04 [SC(CH$_3$)$_3$], 32.71 [InC(CH$_3$)$_3$], 31.84[InC(CH$_3$)$_3$]. Similarly, [($^n$Bu)$_2$In(S$^t$Bu)]$_3$ can be formed by employing the same method, but using tris-n-butyl indium.

Thermogravimetric analyses were obtained on a Seiko 200 TG/DTA instrument using an argon carrier gas. Mass spectra were obtained by using a JEOL AX-505H mass spectrometer and associated data system. An electron beam energy of 70 eV was used for EI mass spectra, with a mass resolution of 1500. Reported m/z values are for the predominant ion within the isotope pattern for each signal. The IR spectrum (4000–400 cm$^{-1}$) was recorded on a Nicolet 5ZDX-FTIR spectrometer as a KBr disk. $^1$H and $^{13}$C NMR spectra were obtained on a Bruker AM-400 spectrometer, and chemical shifts are reported relative to SiMe$_4$ in CDCl$_3$. XPS were collected on a Surface Science Instruments Spectrometer (Model SSX-100) with a monochromatized AlK$\alpha$ source. The spectra were acquired with a 50 eV pass energy and a 1000 $\mu$m spot size. All samples were sputtered with 3 keV Argon ions prior to data collection to remove adventitious carbon. All spectra were charge referenced independently to graphitic carbon ($C_{1s}$=284.8±0.1 eV), and gold ($Au_{4f_5}$=84.0±0.1 eV).

TEM was performed on a Phillips EM420 analytical electron microscope operating at 120 kV.

All manipulations were carried out under a nitrogen atmosphere. Solvents were dried over sodium under nitrogen, and degassed prior to use. $^tBuSH$ (Aldrich) was a commercial sample, and was used without further purification. $In(^tBu)_3$ was prepared according to Bradley et al., *Organometallics*, 7: 1112 (1988), the teachings of which are incorporated herein by reference.

EXAMPLE III $[(^tBu)GaS]_6$ was formed by heating solid $[(^tBu)GaS(-py)]_3$ (1.0 g, 1.40 mmol) to ca. 200°–220° C. under vacuum ($10^{-3}$ torr). A small quantity of $[(^tBu)GaS]_4$ began to sublime after 15 minutes at this temperature, and condensed on cooler parts of the flask. After about 1 hour, heating was stopped, and the contents allowed to cool to room temperature. $^1H$ NMR indicated that the non-sublimed material remaining consisted mainly of one new species with some $[(^tBu)GaS]_4$ (ca. 15%) and $[(^tBu)GaS]_8$ (ca. 30%) also present. Some crystalline material was separated by hand, the crystals which were hexagonal in shape, and whose $^1H$ NMR indicated them to be the new species. Yield 0.2 g, 50%. mp 230 (subl.). MS, m/z (EI, %): 897 (6M+-$^tBu$, 60%), 636 (4M+, 35%), 579 (4M+-$^tBu$, 100%). (CI, $NH_3$, %): 970 (6M++$NH_3$, 25%), 953 (6M+, 30%), 897 (6M+-$^tBu$, 15%). IR (Nujol): 1171(s), 1007(m), 941(w), 807(m), 722(w), 529(w). NMR ($C_6D_6$) $^1H$ 1.23 [s, $C(CH_3)_3$]. Analytical procedure was the same as that described for Example I.

EXAMPLE IV

Deposition of Passivating/buffer Film

Depositions were carried out in an atmospheric pressure laminar-flow hot-wall glass reactor. Argon was passed through a $Cr/Cr_2O_3$ gas purifier prior to entry into the chamber. The CVD system was loaded with substrates and purged for at least 2 hours prior to deposition, during which time the hot zone was brought to the deposition temperature (300°–380° C.). Outflow from the reaction chamber exited to an oil bubbler, which prevented back flow of air into the reaction chamber.

Once the chamber was brought to the desired temperature for deposition, approximately 500 mg of $[(^tBu)_2In(\mu-S^tBu)]_2$ was added and brought to a temperature of 169°–200° C. After each deposition, the films were allowed to cool in the reactor under a flow of the carrier gas. Deposition was carried out on a p-type (100) oriented silicon wafers and KBr crystals.

Results of Deposition

The reaction of $In^tBu_3$ with one equivalent of $^tBuSH$ yielded the dimeric thiolate compound $[(^tBu)_2In(\mu-S^tBu)]_2$, as shown below in Equation (1):

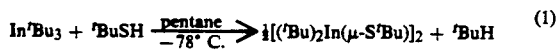

(1)

$[(^tBu)_2In(\mu-S^tBu)]_2$ was characterized by $^1H$ and by $^{13}C$ NMR, and IR spectroscopy. Thermogravimetric analyses were obtained on a Seiko 200 TG/DTA instrument using an argon carrier gas. Mass spectra were obtained by using a JEOL AX-505H mass spectrometer and associated data system. An electron beam energy of 70 eV was used for EI mass spectra, with a mass resolution of 1500. Reported m/z values were for the predominant ion within the isotope pattern for each signal. The IR spectrum (4000–400 cm$^{-1}$) was recorded on a Nicolet 5ZDX-FTIR spectrometer as a KBr disk. $^1H$ and $^{13}C$ NMR spectra were obtained on a Bruker AM-400 spectrometer, and chemical shifts were reported relative to $SiMe_4$ in $CDCl_3$. XPS were collected on a Surface Science Instruments Spectrometer (Model SSX-100) with a monochromatized Al-K$\alpha$ source. The spectra were acquired with a 50 eV pass energy and a 1000 $\mu$m spot size. All samples were sputtered with 3 keV Argon ions prior to data collection to remove adventitious carbon. All spectra were charge-referenced independently to graphitic carbon ($C_{1s}=284.8\pm0.1$ eV), and gold (Au $4f^{7/2}=84.0\pm0.1$ eV). TEM was performed on a Phillips EM420 analytical electron microscope operating at 120 kV.

All manipulations were carried out under a nitrogen atmosphere. Solvents were dried over sodium under nitrogen, and degassed prior to use. $^tBuSH$ (Aldrich) was a commercial sample, and was used without further purification. $In(^tBu)_3$ was prepared according to literature Bradley et al., *Organometallics*, 7: 1112 (1988) the teachings of which are incorporated herein by reference.

The medium resolution EI mass spectrum indicated that $[(^tBu)_2In(\mu-S^tBu)]_2$ existed as a thiolate-bridged dimer in the gas phase, analogous to crystallographically-characterized thiolate compounds of aluminum (See Oliver et al., *Polyhedron*, 9:409 (1990), the teachings of which ware incorporated herein by reference).

Thermogravimetric analysis (TGA) of $[(^tBu)_2In(\mu-S^tBu)]_2$ were performed under an inert (dry $N_2$) atmosphere displayed endotherms at ca.167° C., indicative of partial sublimination of the dimer, followed by a weight loss and exotherm at ca.224° C., consistent with the decomposition of the molecule. Chemical vapor deposition (CVD) was therefore performed operating within this sublimation-decomposition 'window' by subliming the precursor at 169° C. into a horizontal-flow hot-walled chamber maintained at atmospheric pressure, with deposition temperatures between 300–380° C. Deposition obtained by this method was found to be very poor. Film thicknesses obtained after ca. 12 hours were non-uniform and estimated to be in the range of 3–4 nm, as evidenced by the presence of an attenuated substrate signal by X-ray photoelectron spectroscopic analysis, i.e., depth of XPS analysis is typically 3–5 nm. Furthermore, substantial precursor decomposition was noted with the initially white powder turning a mixture of yellow, black and translucent materials. Sublimation with no noticeable precursor decomposition was, however, successfully enabled under vacuum (@$10^{-3}$ Torr) at 60° C.

Figure 8:
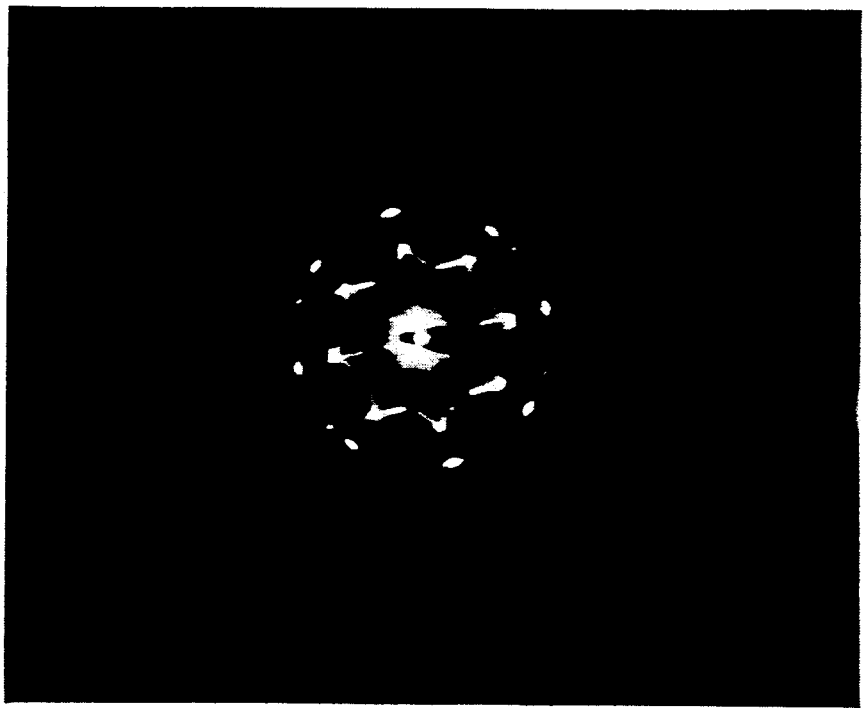
FIG. 8 is a selected-area electron diffraction pattern of the InS film shown in FIG. 3.
Figure 7:
FIG. 7 is a bright-field TEM image of an InS film formed by the method of the invention.

Deposited films were floated off KBr wafers and analyzed by transmission electron microscopy (TEM). FIG. 7, the bright field image, showed the film to consist primarily of uniform growth laths ca. 10 nm in width. A defined set of trigonal growth directions (i.e., 120° rotation) was visually identified in the (lighter) background or base layer in this film. This was reflected in the selected-area electron diffraction pattern, FIG. 8, where, despite the polycrystalline nature of the film, a well-defined spot pattern indicative of preferred orientation was obtained. The structure determined from electron diffraction results was found to be the $Hg_2Cl_2$-type tetragonal structure; consistent with the known high pressure form of InS reported in Kabalkina et al., Solid State Comm., 44:1383 (1982) the teachings of which are incorporated by reference. EDX analysis indicated a film composition of In:S to be 50:50 (±2%) in support of this identification.

EXAMPLE V

Deposition of GaS was performed in a horizontal flow hot-walled CVD chamber, as described above. A precursor, [($^t$Bu)GaS]$_4$, was sublimed at 760 torr at 225° C. and deposited using pre-dried argon as the carrier gas onto n-type GaAs (undoped) and p-type GaAs substrates held at 390±10° C. Film thicknesses were estimated to be ~4000–5000 Å by comparison to Rutherford backscattering (RBS) spectra of Si wafers coated alongside the GaAs substrates; this was done to preclude damaging the GaAs samples by the irradiation used for RBS. GaS had a high bandgap: the films appeared clear when grown on glass substrates. GaS also formed an excellent anti-reflective layer on GaAs when grown to a suitable thickness.

X-ray photoelectron spectroscopy (XPS) analysis showed that the films were carbon- and oxygen-free beneath the surface coverage of Ga$_2$O$_3$ and were GaS in composition: the composition was confirmed by RBS, transmission electron microscopic and energy dispersive x-ray analyses. Peak shifts for the Ga $2p^{3/2}$ were $2p^{\frac{1}{2}}$ were 105.3±0.2eV and 108.7±0.2eV, respectively, vs. Au $4f^{7/2}$=84 eV reference.

Figure 9:
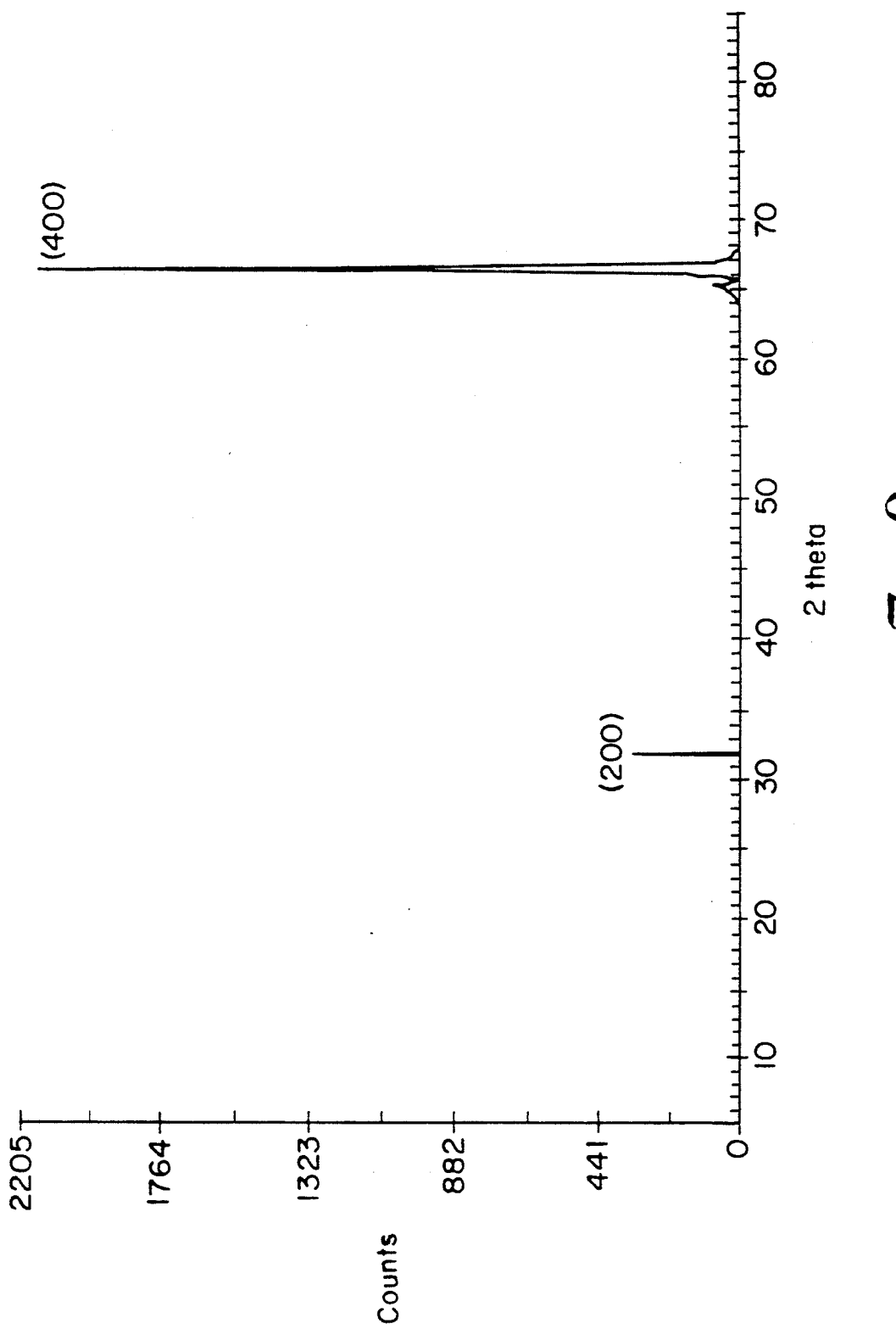
FIG. 9 is a plot of an X-ray diffraction pattern from $2\theta = 5°-85°$ of a sample of GaS chemical vapor deposited on GaAs by the method of the invention, with {200} and {400} regions indicated.
Figure 10:
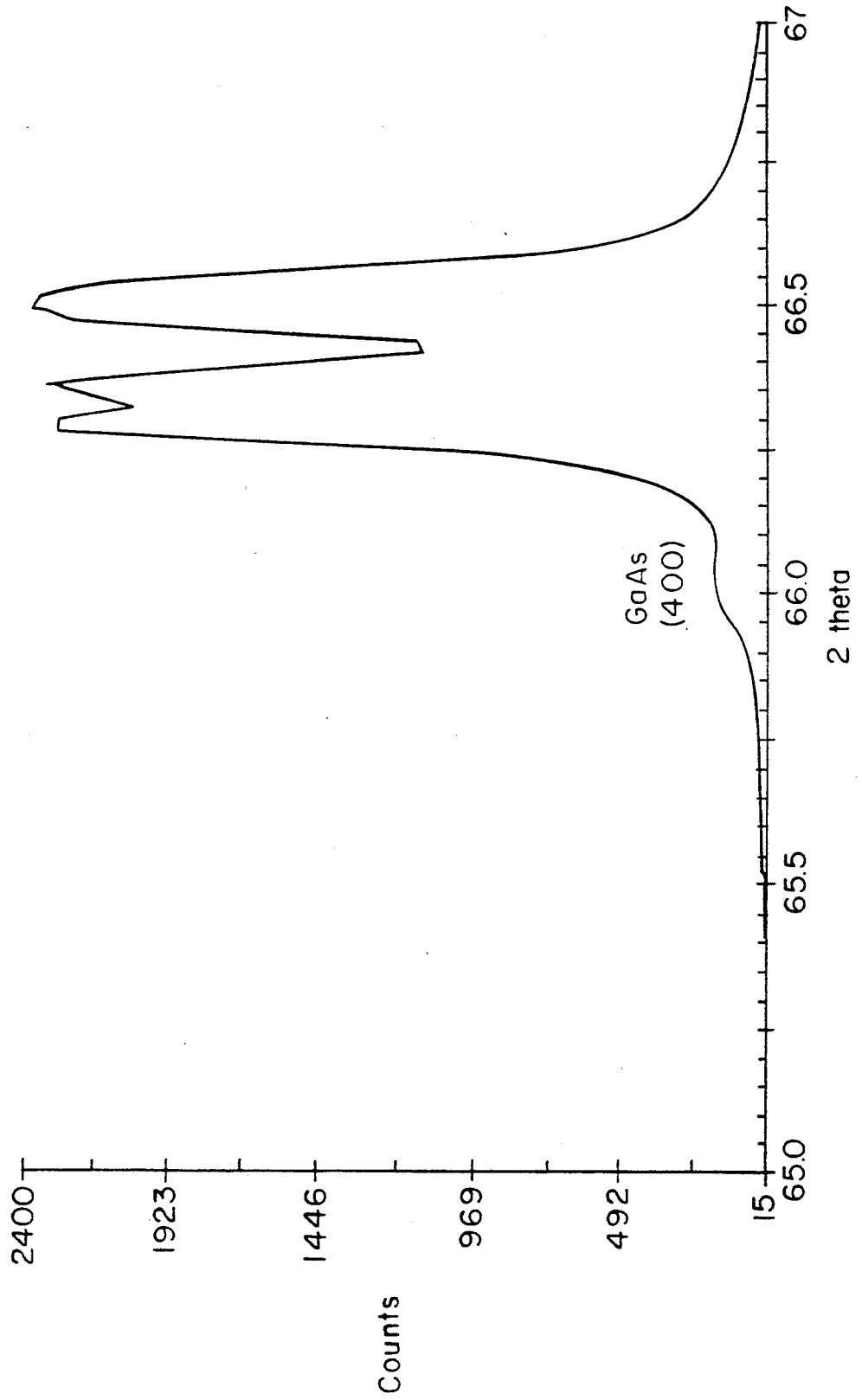
FIG. 10 is a plot of an X-ray diffraction pattern from $2\theta = 65°-67°$ of the sample represented in FIG. 4, of GaS chemical vapor deposited on GaAs at about the {400} region.
Figure 11A:
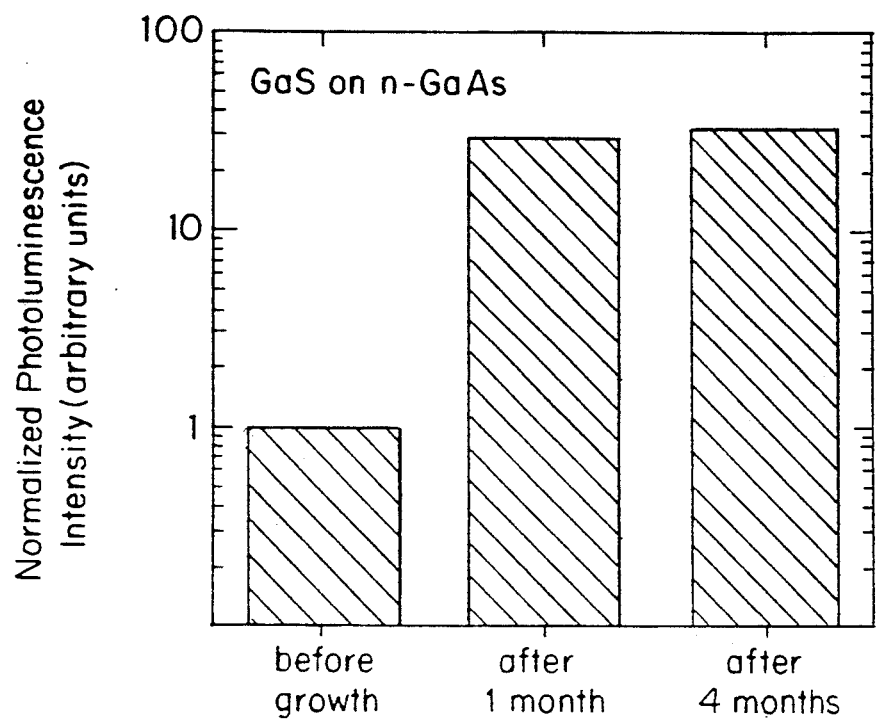
FIG. 11a and 11b are histograph of photoluminescence intensity for samples of GaS which has been vapor deposited onto GaAs by the method of the invention.
Figure 11B:
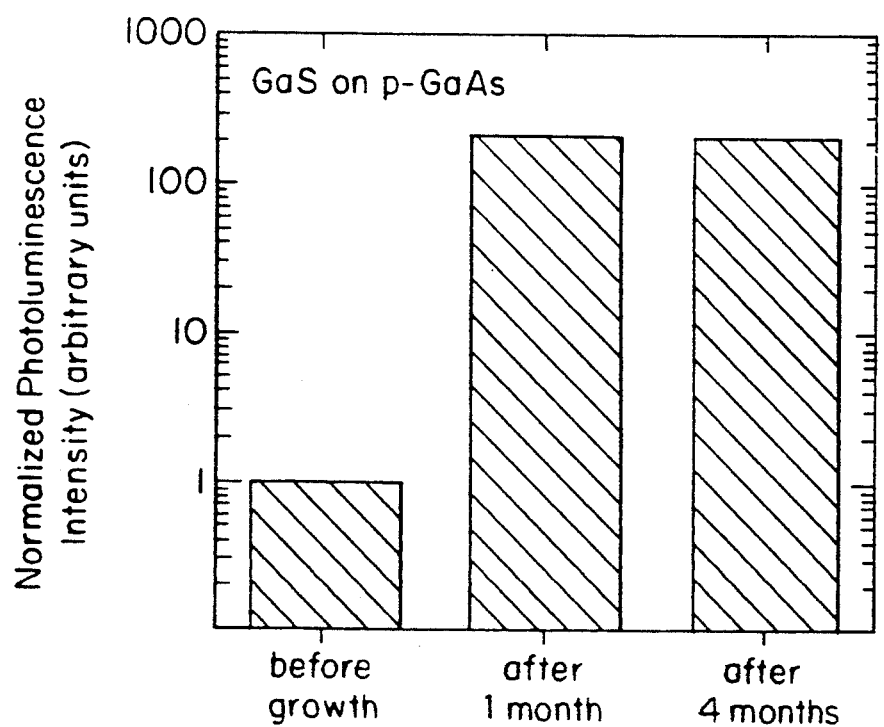

FIG. 9 shows the X-ray diffraction patterns of a typical GaS-coated GaAs substrate. Two prominent peaks corresponding to d-spacings of 2.803 and 1.409 Å are evident. Although the underlying single-crystal GaAs would allow for reflections in these regions, {200} and {400} at 2.828 and 1.414 Å, respectively, a higher resolution scan, shown in FIG. 10, around the {400} reflection, reveals that this singlet is comprised of at least four component peaks. The peak at 1.414 Å may be attributed to the substrate GaAs {400} reflection attenuated by the GaS overlayer, as expected. The other peaks are most likely the {400} reflection of the GaS coating displaying a range of d-spacings around an average value of 1.408 Å. The lattice parameter of this epitaxial GaS coating corresponds to a calculated cell constant of 5.63 Å.

The passivation of the GaS/GaAS interface was evaluated by measuring the PLI before and after GaS deposition. The 514 nm line of an Ar+ laser at a power density of approximately 1W/cm$^2$ was used for excitation. A large area silicon diode was employed to detect PL radiation from behind the sample. The details of the PLI instrumentation are described in Jenkins, et al., Proc. 21st IEEE Photovoltaic Spec. Conf., Kissimis, Fla. 1:399 (1990), the teachings of which are incorporated herein by reference. FIG. 7a and FIG. 7b show dramatic increases in the PLI of both p-type and n-type GaAs samples, respectively. We observed less than 2% signal decay during experiments for periods exceeding one hour. Pretreatment of the GaAs substrates was limited to oxide removal in 50% HCl and drying under nitrogen.

The sharp increases in PLI indicated that surface recombination velocity decreased and/or alteration of band bending to reduce any front surface depletion region. Cubic-phase GaS epitaxially grown at less than 400° C. formed stable passivating layers on both p- and n-type GaAs. Photoluminescence measurements showed that the interface exhibited a substantial decrease in surface related-recombination and remained stable after 4 months.

Equivalents

Those skilled in the art will recognize, or be able to ascertain using no more than routine experimentation, many equivalents to the specific embodiments of the invention described specifically herein. Such equivalents are intended to be encompassed in the scope of the following claims.

We claim:

1. A method of forming a passivating/buffer film on a substrate, comprising the steps of:
    a) heating the substrate to a temperature sufficient to cause a precursor to pyrolyze and be deposited on the substrate;
    b) volatilizing the precursor, which consists essentially of a single cubane or cubane-forming organometallic compound, at a precursor source; and
    c) directing a carrier gas from a carrier gas source across the precursor source to conduct the volatilized precursor from the precursor source to the substrate, whereby the volatilized precursor is pyrolyzed and is deposited onto the substrate, thereby forming the passivating/buffer film on said substrate.

2. The method of claim 1 wherein the organometallic compound is a cubane organometallic compound.

3. The method of claim 2 wherein the precursor is (($^t$Bu)GaS)$_4$.

4. The method of claim 2 wherein the precursor is (($^t$Bu)AlS)$_4$.

5. The method of claim 2 wherein the precursor is (($^t$Bu)GaSe)$_4$.

6. The method of claim 2 wherein the precursor is (($^t$Bu)GaTe)$_4$.

7. The method of claim 1 wherein the organometallic compound is a cubane-forming organometallic compound.

8. The method of claim 7 wherein the cubane-forming organometallic compound is (($^t$Bu)GaS)$_4$.

9. The method of claim 1 wherein the precursor includes selenium.

10. The method of claim 1 wherein the precursor includes tellurium.

11. The method of claim 1 wherein the precursor includes gallium.

12. The method of claim 1 wherein the precursor includes aluminum.

13. The method of claim 1 wherein the precursor further includes at least one tertiary butyl group.

14. The method of claim 13 wherein the substrate includes gallium arsenide.

15. The method of claim 13 wherein the substrate further includes aluminum.

16. The method of claim 15 wherein the aluminum is a component of an aluminum-containing compound.

17. The method of claim 1 wherein the precursor is (($^n$Bu)InSe)$_x$ and wherein x is in the range of between about four and eight.

18. The method of claim 1 wherein the precursor is (($^t$Bu)GaS)$_7$.

19. The method of claim 1 wherein the precursor is (($^n$Bu)InS)$_x$ and wherein x is in the range of between about four and eight.

20. The method of claim 1 wherein the precursor is (($^t$Bu)$_2$In(S$^t$Bu))$_2$.

21. The method of claim 1 wherein the precursor is (($^n$Bu)$_2$In(S$^t$Bu))$_3$.

22. The method of claim 1 wherein the precursor is (($^t$Bu)$_2$Ga(S$^t$Bu))$_2$.

23. The method of claim 1 wherein the film formed is lattice-matched with the substrate.

* * * * *

UNITED STATES PATENT AND TRADEMARK OFFICE
CERTIFICATE OF CORRECTION

PATENT NO. : 5,300,320

DATED : April 5, 1994

INVENTOR(S) : Andrew R. Barron, Michael B. Power & Andrew N. MacInnes

It is certified that error appears in the above-identified patent and that said Letters Patent is hereby corrected as shown below:

On the Title Page of the "Inventors" section [75] delete Aloysius F. Hepp and Phillip P. Jenkins Signed and Sealed this Twenty-third Day of August, 1994

Attest:

BRUCE LEHMAN

*Attesting Officer*  *Commissioner of Patents and Trademarks*